United States Patent [19]

Hirabayashi

[11] Patent Number: 5,450,033
[45] Date of Patent: Sep. 12, 1995

[54] FREQUENCY DEMODULATION CIRCUIT

[75] Inventor: Atsushi Hirabayashi, Tokyo, Japan

[73] Assignee: Sony Corporation, Tokyo, Japan

[21] Appl. No.: 287,257

[22] Filed: Aug. 8, 1994

[30] Foreign Application Priority Data

Aug. 10, 1993 [JP] Japan .................. 5-216923

[51] Int. Cl.⁶ ............................................. H03D 3/06
[52] U.S. Cl. ............................... 329/315; 329/319;
329/337; 455/214; 455/337; 327/39; 327/47
[58] Field of Search .............. 329/315, 318, 319, 327,
329/336, 337, 344; 327/39, 47; 375/324;
455/214, 337

[56] References Cited

U.S. PATENT DOCUMENTS

| | | | |
|---|---|---|---|
| 4,079,330 | 3/1978 | Ishigaki et al. | |
| 4,198,609 | 4/1980 | Ishigaki et al. | 329/337 X |
| 4,388,595 | 6/1983 | Brooks | 329/336 |
| 4,451,792 | 5/1984 | Gay | 455/214 X |
| 5,161,004 | 3/1992 | Egger | |
| 5,307,380 | 4/1994 | Kume | 455/214 X |
| 5,341,107 | 8/1994 | Bijker et al. | 329/336 X |

FOREIGN PATENT DOCUMENTS 445886 9/1991 European Pat. Off. .

OTHER PUBLICATIONS

International Journal of Electronics, vol. 34, No. 2, Feb. 1973, London GB pp. 241–246 S. K. Das et al. 'Active RC all-pass networks using a summation or a differential amplifier' p. 244, line 1–line 3; figures 3A, 3B.

*Primary Examiner*—David Mis
*Attorney, Agent, or Firm*—William S. Frommer; Alvin Sinderbrand

[57] ABSTRACT

A frequency demodulation circuit having an improved detection sensitivity is provided by forming an all-pass equalizer in a Quadrature-type demodulator capable of allowing a band covering at least a carrier frequency deviation to pass therethrough. The equalizer comprises a band-pass filter for detecting the frequency deviation of an inputted FM carrier signal, a gain-doubling amplifier and a substractor for performing subtraction between the signal inputted to the band-pass filter and the output of the amplifier. The operation of the circuit is such that a FM carrier signal is supplied to the band-pass filter through a phase shifter and to a phase comparator and the output of the substractor and the FM carrier signal are compared to each other by the phase comparator to thereby obtain a FM demodulated signal.

9 Claims, 5 Drawing Sheets

Quadrature detection

PLL FM DETECTION

FREQUENCY DEMODULATION CIRCUIT

BACKGROUND OF THE INVENTION

1. Field of the Invention

The present invention relates to a frequency demodulation circuit for detecting a modulated signal from a FM (frequency modulation) carrier signal.

2. Prior Art

Frequency modulation (hereinafter referred to as "FM") has a higher S/N than an amplitude modulated wave with respect to external noises and it is a modulation system commonly used for transmitting information by means of television voice signals, stereophonic FM broadcasting and the like.

As a FM detector for detecting a modulated signal from a FM-modulated carrier signal, there is commonly used a ratio detector, Foster-Seely detector and etc. but with the development of semiconductor technology, Quadrature detectors, PLL-type detectors or the like have come to be incorporated into receivers.

FIG. 6 is a block diagram of a Quadrature detector of the type mentioned above. In this figure, reference numeral 1 designates a 90 phase-shifting circuit having a FM carrier signal inputted therein, reference numeral 2 designates a band-pass filter (BPF) which has been adjusted to make the FM carrier frequency its center frequency and reference numeral 3 designates a multiplier which detects the phase difference between the above-mentioned FM carrier signal and the output of BPF 2 to thereby detect a FM signal. Then the detected signal is outputted as a voice signal through a low-pass filter (LPF) 4.

Assuming that the angular frequency of the FM carrier signal is $\omega$, the BPF 2 generates a signal of lead phase with respect to the center frequency $f_0$ ($\omega_0$) thereof when the relationship of $\omega_0 > \omega$ is established while it generates a signal of lag phase when the relationship of $\omega_0 < \omega$ is established.

Accordingly, as shown in FIG. 6B, when the product of the signal waveform of a FM carrier signal $\omega + 90°$ inputted to the BPF 2 and the output waveform $\omega$ of the BPF 2 only when it is positive is detected, the detection output in a period in which both of the FM carrier signal $\omega + 90°$ and the output waveform w are positive is detected. The average voltage of this output changes around $\omega = \omega_0$. Accordingly, the modulation signal component of the FM carrier signal can be detected by integrating this output with the LPF 4.

FIG. 7 is a schematic block diagram of a PLL-type FM demodulator wherein reference numeral 5 designates a phase comparator, reference numeral 6 designates a low-pass filter (LPF) and reference numeral 7 designates a voltage-controlled oscillator (VCO) the oscillation frequency of which is controlled by the output of the LPF 6.

As is well known, this circuit is applied with a feedback control so that the VOC 7 is locked to the frequency of the inputted FM carrier signal and a difference signal corresponding to the change in the center frequency of the VCO 7 and the frequency of the FM carrier signal is taken out of the LPF 7.

Every FM demodulation circuit of the type described above uses a phase variable circuit comprising a BPF, substitutes the difference between the FM carrier frequency fo for a phase deviation and then converts it into a voltage amplitude by using a phase comparator thereby detecting a FM signal wave.

Accordingly, it is necessary that the reference frequency fo be made to coincide with the center frequency of the FM carrier signal and the demodulation characteristics of the detector depend much on the accuracy of coincidence.

For this reason, the variation of f0 taking place by the nonconformity of the values of the constituent elements (such as a coil L and a capacitor C) of a variable phase device has hitherto been corrected by adjusting the value of such coil or capacitor. However, such adjustment requires not only a quite high level of accuracy of itself but also the preciseness of temperature range, secular change and the constituent elements of the device, which results in an increase in the cost of the entire system.

Further, where the above-described FM demodulation system is used for the voice signal demodulation circuit of a television receiver, if the television is of the NTSC system, the voice carrier frequency is in the order of 4.5 MHz while when, in Europe, it is of the B/G system, the voice carrier frequency is in the order of 5.5 MHz, when it is of the D/K system, that frequency is in the order of 6.5 MHz and when it is of the I system, the carrier frequency of the voice FM signal is in the order of 6.0 MHz, depending on the district where the television is used.

Accordingly, there has arisen the problem that these television receivers have to be provided with FM demodulation circuits having different center frequencies fo and so the number of parts and the number of portions to be adjusted increase inevitably thereby reducing the production efficiency.

SUMMARY OF THE INVENTION

In order to solve the above problems, the present invention provides a frequency demodulation circuit which comprises a band-pass filter to which a FM carrier signal is inputted, an amplifier for doubling the output level of the band-pass filter, a substractor for outputting the difference signal between the input signal of the band-pass filter and the output of the amplifier and a phase detector for detecting the phase difference signal between the output of the substractor and a signal obtained by phase-shifting by 90 the signal inputted to the band-pass filter, whereby a modulation signal of the FM carrier signal is detected from the phase detector.

Further, the phase detector of the present invention is also constructed such that the center frequency of the band-pass filter can be controlled to coincide with the carrier frequency without any adjustment even when the FM carrier frequency changes, by making the center frequency of the band-pass filter adjustable by a control signal identical with the output of the phase detector which is detecting the FM signal.

As described above, according to the present invention, there are provided, at the back stage of a band-pass filter for detecting the frequency deviation of an inputted FM carrier signal, an amplifier for doubling the amplitude of the output of the band-pass filter and a substractor whereby subtraction is performed with the substractor between the signal inputted to the band-pass filter dilter and the output of the amplifier so that an all-pass equalizer is formed. In this case, as the output of the equalizer is used as a target signal for detecting a phase deviation, the sensitivity of detection of the phase deviation can be doubled as compared to the conventional Quadrature-type FM detector thereby enhancing the detection sensitivity of the detector.

Further, according to one embodiment of the present invention to be described hereinbelow, there is provided an all-pass equalizer in a control loop to make constant the amplitude of a phase deviated signal inputted to the phase comparator so that the center frequency of the band-pass filter can be corrected by the output of a phase detector for detecting the phase change of this signal and as regards the FM signal modulated by a carrier frequency in a certain range, a FM detection output can be obtained without any adjustment to the signal.

BRIEF DESCRIPTION OF THE DRAWINGS

FIG. 6C is a diagram showing waveforms of a FM carrier signal and the band-pass filter of FIG. 6B.

PREFERRED EMBODIMENT OF THE INVENTION

Figure 1:
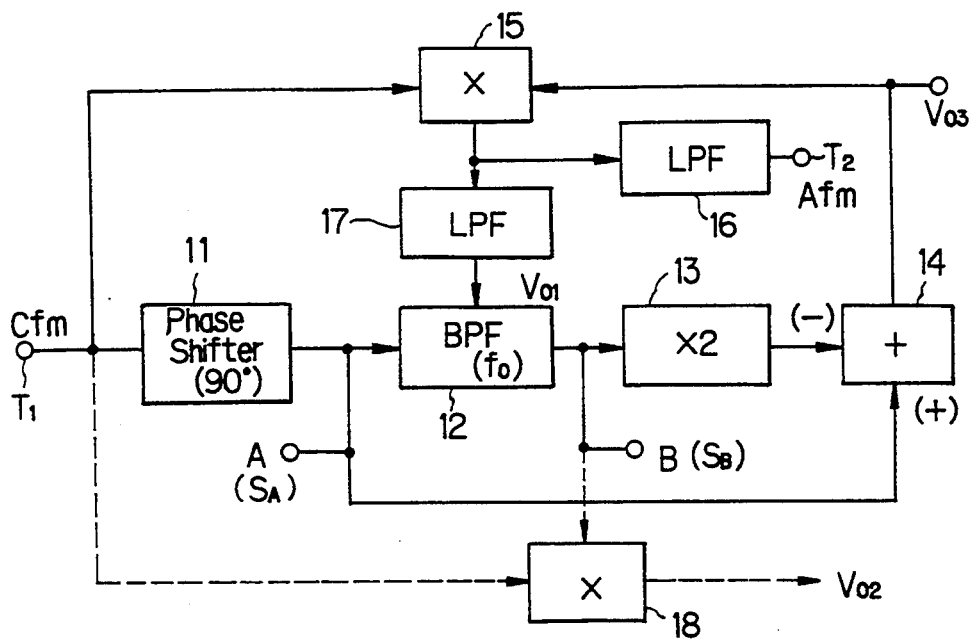
FIG. 1 is a block diagram of a FM demodulation circuit according to one embodiment of the present invention.

Referring to FIG. 1 which is a block diagram of a basic FM demodulation circuit of the present invention, a FM carrier signal $C_{fm}$ inputted from a terminal T1 is supplied to a 90° phase shifter 11 and then to a band-pass filter (BPF) 12 having a center frequency substantially equal to a career frequency $f_0$.

The carrier signal phase-shifted in response to the frequency characteristics of the BPF 12 is then inputted to an amplifier 13 for doubling the amplitude of the signal and is supplied to one of input terminals of a substractor 14 (an adder with respect to a negative signal).

To the other input terminal of the substractor 14 there is supplied an output ($S_A$) of the phase-shifter 11 and subtraction is performed between the output ($S_A$) and an output ($S_B$) of the BPF 12. Then a subtraction output signal $V_{03}$ from the substractor is supplied to a phase comparator 15 to detect a phase difference from the FM carrier signal $C_{fm}$ being inputted.

Reference numeral 16 designates a LPF (low-pass filter) having the above-mentioned phase difference signal inputted thereto and the output thereof becomes a modulated signal $A_{fm}$.

Reference numeral 17 designates a LPF (low-pass filter) for controlling the center frequency of the BPF as will be described later.

Figure 2A:
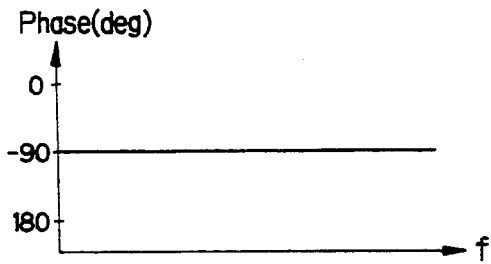
FIG. 2A is a diagram showing the phase-shifting characteristic of a phase shifter forming part of the FM demodulation circuit of FIG. 1.
Figure 2B:
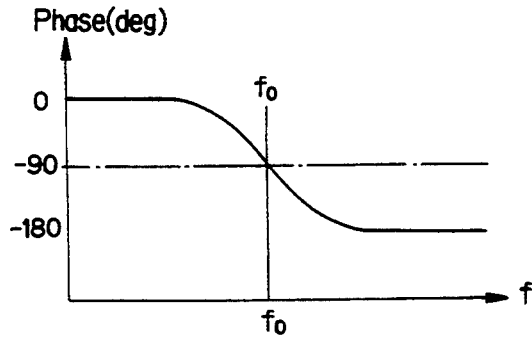
FIG. 2B is a diagram showing the phase-shifting characteristic of a band-pass filter forming part of the FM demodulation circuit of FIG. 1.

FIG. 2A shows the phase-shifting characteristic of the above-mentioned phase shifter 11 and FIG. 2B shows the phase-shifting characteristic of the BPF 12 whose center frequency is set to $f_0$. That is, when the center frequency of the FM carrier frequency is assumed to be $f_0$, the shifting amount of the BPF will be zero and the BPF will be phase-shifted in a range of between ±90° and −90° depending on the frequency deviation of the modulated wave.

Figure 2C:
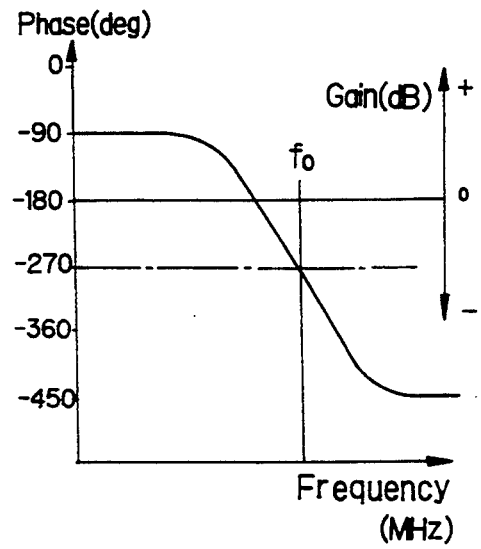
FIG. 2C is a diagram showing the phase-shifting characteristic of a substractor forming part of the FM demodulation circuit of FIG. 1.

As the substractor 14 doubles the level of the output ($S_B$) of the BPF 12 and adds the phase-inverted signal and the output ($S_A$) of the phase shifter 11, the phase-shifting characteristic thereof is such that a phase shift in the range between −90° and −450° is given as shown in FIG. 2C.

Figure 3A:
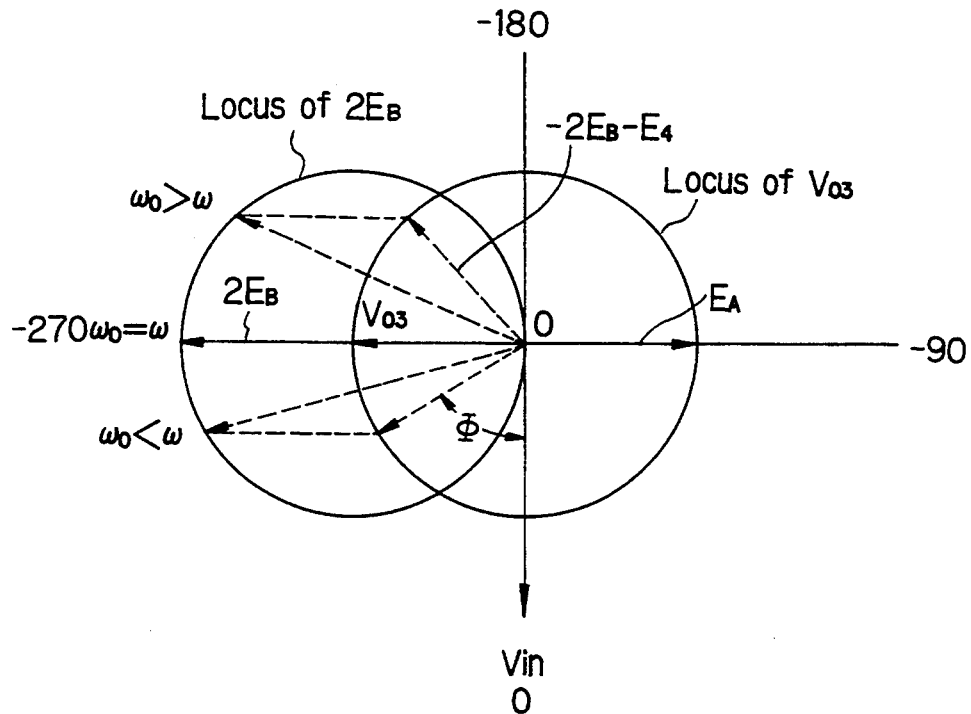
FIG. 3A is a diagram showing, in the forms of vectors, the phases of signals from the elements forming the FM demodulation circuit of FIG. 1.

FIG. 3A shows the phases of the above-mentioned signals in the forms of vectors, respectively, wherein the output signal of the phase shifter 11 is shown as $E_A$ and the output of the amplifier 13 is shown as $2E_B$ with respect to the RFM carrier input signal Vin ($C_{fm}$). The signal $2E_B$ is expressed by the momentum of a vector moving along a circle according to the shifting amount of the BPF 12 and a sum of vectors of the signal $2E_B$ and the output signal $E_A$ of the phase shifter 11 which is indicative of the output $V_{03}$ of the substractor 14 comes to lie on a circle about an origin 0.

Accordingly, at the center frequency $f_0$ of the FM carrier signal the output signal $V_{03}$ is phase-shifted by −270° and the shifting amount is in the range of between +180° and −180° depending on the frequency deviation of the FM signal. Then, the phase difference between the shifted signal $V_{03}$ and the inputted FM carrier signal $V_{in}$ is detected by the phase comparator 15 whose output is generated as a FM demodulation signal through the LPF 16. In this case, the LPF 16 may be omitted depending on the type of the phase comparator 15.

A mathematical description of the above point will be as follows:

A general expression of the transfer function T (S) of the $B_{PF}$ will be:

$$T_{(S)} = \frac{\frac{\omega_0}{Q} \cdot S}{S^2 + \frac{\omega_0}{Q} \cdot S + \omega_0^2} \quad (1)$$

The output $V_{03}$ of the substractor 14 will be:

$$V_{03} = A - 2A \cdot T_{(s)} \quad (2)$$

Hence, there will be obtained from the equations 1 and 2 the following:

$$V_{03} = A \cdot \left[ \frac{S^2 - \frac{\omega_0}{Q} \cdot S + \omega_0^2}{S^2 + \frac{\omega_0}{Q} \cdot S + \omega_0^2} \right] \quad (3)$$

Since the term 2 of the denominator is equal to the term 2 of the numerator in the brackets of the equation 3, this equation represents a transfer function indicative of an all-pass type secondary filter, i.e., an equalizer.

Further, assuming that the FM carrier signal $C_{fm}$ be $V_{in}$, the phase shifter 11 may be regarded as a differentiation circuit (S) so that the equation of $A = S \cdot V_{in}$ will be established and the equation 3 will become:

$$\frac{V_{03}}{V_{in}} = S \cdot \frac{S^2 - \frac{\omega_0}{Q} \cdot S + \omega_0^2}{S^2 + \frac{\omega_0}{Q} \cdot S + \omega_0^2} \tag{4}$$

Figure 3B:
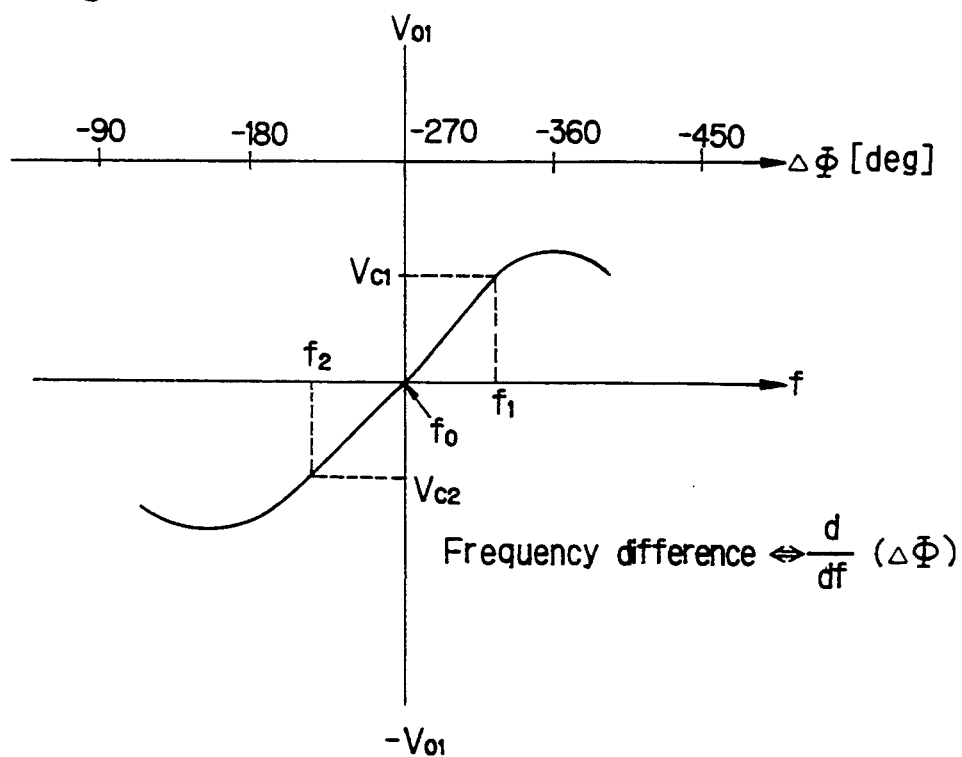
FIG. 3B is a diagram illustrating the detection sensitivity of the circuit of FIG. 1.

From the above equation 4, it will be seen that the detection characteristic of the output signal $V_{01}$ showing the phase difference between $V_{in}$ and $V_{03}$ allows the phase demodulation characteristic shown in FIG. 3B to be obtained due to the deviation of the FM carrier frequency.

The output signal $V_{01}$ is an instantaneous phase difference between $V_{in}$ and $V_{03}$ and therefore, what has resulted from differentiation of the phase difference $\Delta\Phi$ between $V_{in}$ and $V_{03}$ is outputted as a frequency difference thereby obtaining the FM demodulation characteristic. Naturally, it is also possible to make such characteristic reversed.

The FM demodulation circuit of the present invention is characterized by signal detection at a phase shift of 270° in contrast to the conventional Quadrature-type detector which performs detection by a phase shift of 90° at the center frequency. Since it can meet the doubled amount of phase variation, it is possible to obtain a doubled signal level of detection output. Consequently, it is possible to improve the S/N at the time of demodulation by 6 dB.

As described with respect to the embodiment of the present invention, the output of the above-mentioned phase comparator 15 is generated to the average level at the LPF 17 which is fed back as a control signal for controlling the center frequency $f_0$ of the BPF 12. Consequently, it is possible to add a function of automatically control the center frequency of the filter system in correspondence to the FM carrier frequency.

Figure 4:
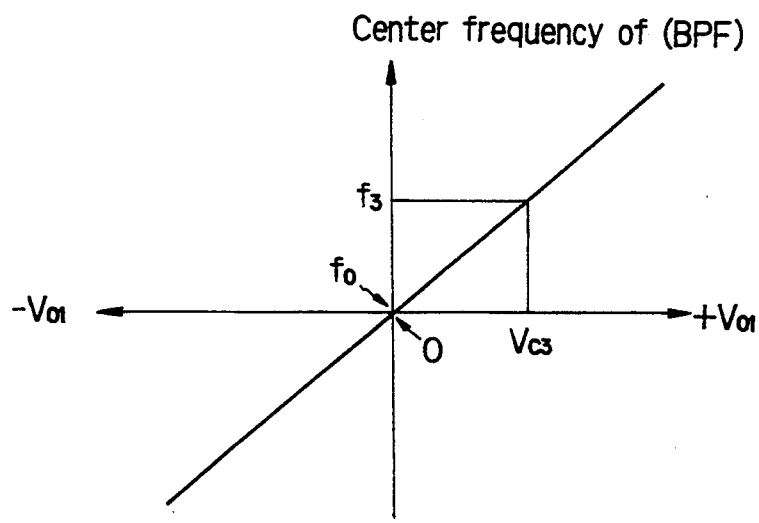
FIG. 4 is a diagram illustrating an operation of correcting the center frequency of a band-pass filter.

That is to say, the output signal $V_{01}$ which indicates the average phase information of the phase comparator 15 shown in FIG. 4 can be regarded as a signal which has detected the frequency difference between the inputted FM carrier frequency and the central frequency $f_0$ ($\omega_0$) of the BPF 12.

Consequently, this signal is the $V_{C1}$ as shown in FIG. 3B and in this case, if the center frequency of BPF 12 is $f_2$, when the center frequency is controlled by the signal $V_{C1}$ to become lower than $f_2$, the equation of $V_{C1} = 0$ is established resulting in the center frequency of the band-pass filter coinciding with the carrier frequency $\omega_0$.

Accordingly, the FM demodulation circuit of the present invention can be nonadjustably applied to a case in which the FM carrier frequency differs depending on the broadcasting system as described above.

Although such nonadjustable use is also possible for the conventional FM demodulation circuit by making use of the phase-shifting characteristic of the band-pass filter, the conventional circuit is influenced by the gain characteristic of the band-pass filter so that the range covered the control loop is limited.

This means that, since the gain decreases due to the change of the center frequency, no phase comparison can be performed over the full frequency.

However, in the case of the present invention, since the output signal $V_{03}$ to be inputted to the phase comparator 15 has been converted to have a predetermined level, pulling to any FM carrier frequency can theoretically be done thereby achieving an automatic circuit operation.

Further, if a second phase comparator 18 is provided in the manner designated by a dotted line in FIG. 1, it is possible to obtain a conventional Quadrature-type detection output $V_{02}$, too.

Figure 5:
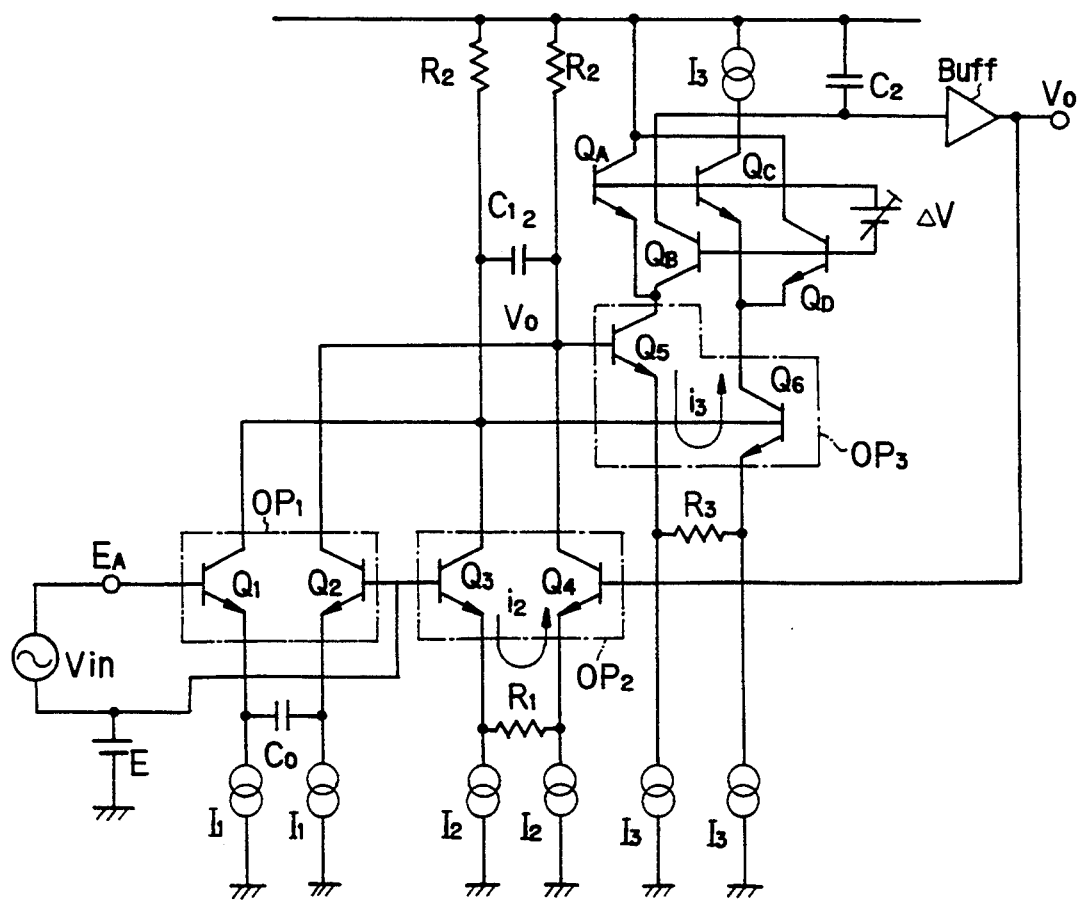
FIG. 5 is a circuit diagram showing one example of a band-pass filter which can be employed in the present invention.
Figure 6A:
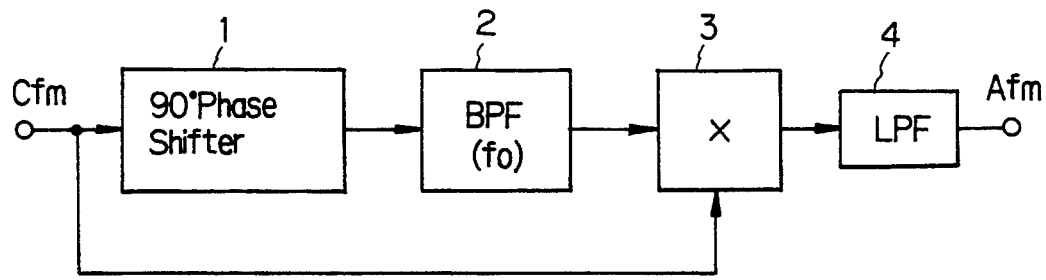
FIG. 6A is a block diagram of a Quadrature-detection type FM demoduration circuit.
Figure 6B:
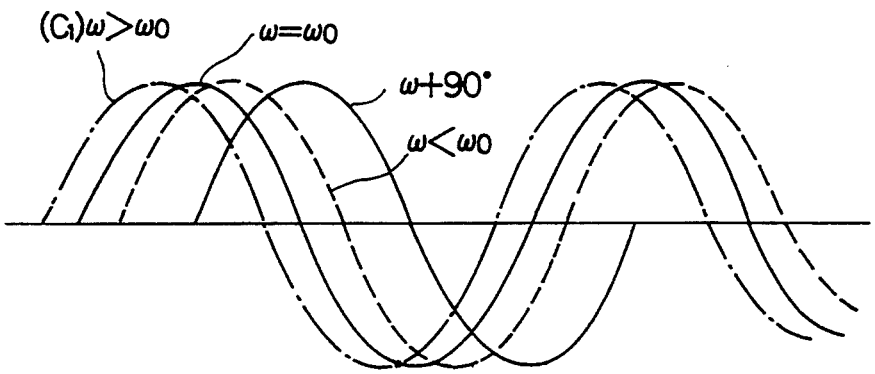
FIG. 6B are waveform showing relationships between the angular frequency of a FM carrier signal and the output of a band-pass filter.
Figure 6B:
Figure 6B:
Figure 6B:
Figure 7:
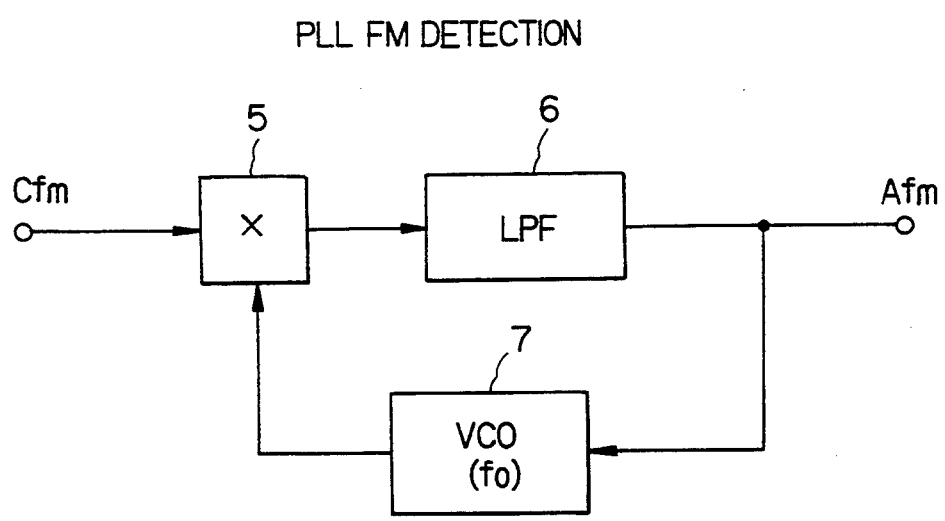
FIG. 7 is a block diagram of a PLL type FM demodulation circuit.

FIG. 5 shows a concrete circuit example of the above-mentioned BPF. This circuit includes, as main components thereof, a pair of transistors Q1 and Q2 constituting a first differential amplifier, a pair of transistors Q3 and Q4 constituting a second differential amplifier and a pair of transistors Q5 and Q6 constituting a third differential amplifier and a FM carrier signal as $V_{in}$ is connected to the base of the transistor Q1.

The second and third transistor pairs constituting a secondary low-pass filter and a band-pass filter is constituted by the provision, in this filter, of the first transistor pair having the emitters thereof connected to the filter through a capacitor Co.

The transfer characteristic $V_0/V_1$ of this circuit may be expressed by:

$$\frac{V_0}{V_{in}} = \frac{\frac{2}{C_1 C_2 R_3} \cdot S}{S^2 + \frac{S}{C_1 R_2} + \frac{2}{C_1 C_2 R_1 R_3}} \tag{5}$$

and the resonance frequency thereof may be expressed by:

$$\omega_0 = \sqrt{\frac{2}{C_1 C_2 R_1 R_3}} \tag{6}$$

As $R_1$ and $R_2$ which designate emitter resistance of the second and third transistor pairs change depending on current sources $i_2$ and $i_3$, if a differential current $i_3$ flowing through the third transistor pairs Q5 and Q6 is varied by transistors $Q_A$, $Q_B$, $Q_C$ and $Q_D$, for example, the resonance frequency of the circuit varies. That is, if the output of the phase comparator 15 is controlled by an average phase differential voltage $\Delta V$ which is obtained by averaging the output of the comparator with the LPF 17, the resistance $R_3$ changes equivalently to change the above-mentioned resonance frequency so that the FM demodulation circuit of the present invention can have the function of automatically correcting the center frequency of the band-pass filter to become the FM carrier frequency.

Although the demodulation circuit shown in FIG. 1 constitutes a full band-pass type equalizer by a band-pass filter, a gain doubling amplifier and a subtraction circuit, it goes without saying that any equalizer circuit can be used without being limited to the above embodiment only if the circuit performs a 180 phase-shifting operation with a certain gain.

As described above, the FM demodulation circuit of the present invention has the advantage that since an equalizer which allows a band covering at least the deviation of the carrier frequency to pass therethrough is provided in a Quadrature-type demodulator and the frequency deviation of the FM modulated wave is detected by the output of the equalizer, the detection sensitivity can be improved by about 6 dB as compared to the conventional Quadrature-type demodulator. Further, since the center frequency of the BPF changes with the carrier of the FM carrier frequency, no adjustment of the center frequency $f_0$ is needed so that the DC offset of the detection output can be made zero and hence, the number of parts can be reduced, the productivity can be improved and a FM demodulator which is highly versatile can be obtained.

What is claimed is:

1. A circuit for demodulating a frequency-modulated carrier signal comprising:
   means for filtering said frequency-modulated carrier signal in band-pass manner;
   means for amplifying the output signal from said filtering means by the predetermined amount;
   means for subtracting the input signal of said filtering means from the output signal of said amplifying means;
   means for providing 90-degree phase difference between the input signal of said filtering means and the output signal of said subtracting means; and
   means for detecting a phase difference therebetween to obtain a demodulated signal from the output thereof.

2. A circuit according to claim 1, in which the output signal from said filtering means is amplified 2 times in amplitude.

3. A circuit according to claim 2, in which said filtering means comprises a band-pass filter having a center frequency corresponding to carrier frequency of said frequency modulating carrier signal.

4. A circuit according to claim 3, in which said band-pass filter comprises active band-pass filter, the center frequency of which is controlled by the output of said detecting means.

5. A frequency demodulating circuit for demodulating a frequency modulated carrier signal comprising:
   a phase detector from which a demodulated signal is fed;
   a frequency equalizer having second-order all-pass filter characteristics, the output of which is supplied to one of inputs of said phase detector;
   a differentiater for differentiating said frequency modulated carrier signal, the output of said differentiater being supplied to another input of said phase detector or input of said frequency equalizer.

6. A frequency demodulating circuit according to claim 5, in which said frequency equalizer comprises a band-pass filter having a corresponding center frequency to carrier frequency of said frequency modulated carrier signal;
   an amplifier for amplifying the output signal of said band-pass filter by the predetermined amount and a subtracter for subtracting the input signal of said band-pass filter from the output signal of said amplifier.

7. A frequency demodulating circuit according to claim 6, in which said amplifier amplifies the amplitude of the output signal from said band-pass filter 2 times.

8. A frequency demodulating circuit according to claim 7, in which said band-pass filter comprises variable frequency band-pass filter;
   a center frequency of which is controlled by the output of said phase detector.

9. A frequency demodulating circuit according to claim 5, in which said differenciater comprises 90°-degree shifter.

* * * * *